(12) United States Patent
Yang et al.

(10) Patent No.: US 8,930,780 B2
(45) Date of Patent: Jan. 6, 2015

(54) SYSTEMS AND METHODS FOR NON-ZERO SYNDROME BASED PROCESSING

(75) Inventors: Shaohua Yang, Santa Clara, CA (US); Bruce A. Wilson, San Jose, CA (US)

(73) Assignee: LSI Corporation, San Jose, CA (US)

( * ) Notice: Subject to any disclaimer, the term of this patent is extended or adjusted under 35 U.S.C. 154(b) by 374 days.

(21) Appl. No.: 13/596,819

(22) Filed: Aug. 28, 2012

(65) Prior Publication Data
US 2014/0068358 A1 Mar. 6, 2014

(51) Int. Cl.
| | |
|---|---|
| G11C 29/00 | (2006.01) |
| H03M 13/00 | (2006.01) |
| G06F 11/00 | (2006.01) |
| G11C 29/10 | (2006.01) |
| G06F 11/10 | (2006.01) |
| H03M 13/15 | (2006.01) |
| H03M 13/29 | (2006.01) |
| G11B 19/04 | (2006.01) |
| G11B 20/18 | (2006.01) |

(52) U.S. Cl.
CPC ............ *G11C 29/10* (2013.01); *G06F 11/1012* (2013.01); *G06F 11/1048* (2013.01); *G06F 11/1008* (2013.01); *G06F 11/1076* (2013.01); *G06F 11/1068* (2013.01); *G06F 11/108* (2013.01); *H03M 13/1525* (2013.01); *H03M 13/1545* (2013.01); *H03M 13/1575* (2013.01); *H03M 13/151* (2013.01); *H03M 13/29* (2013.01); *H03M 13/159* (2013.01); *G11B 19/048* (2013.01); *G11B 20/18* (2013.01)
USPC ............ 714/718; 714/720; 714/702; 714/752; 714/755; 714/763; 714/764; 714/768; 714/769; 714/770; 714/773; 714/785; 714/786; 714/793; 714/799; 714/6.1; 714/6.11; 714/6.2; 714/6.22; 714/6.24; 714/25; 714/30; 714/42; 714/48; 714/52

(58) Field of Classification Search
CPC . G11C 29/10; G06F 11/1012; G06F 11/1008; G06F 11/1048; G06F 11/1068; G06F 11/1076; G06F 11/108; H03M 13/1525; H03M 13/1545; H03M 13/1575; H03M 13/151; H03M 13/159; H03M 13/29; G11B 20/18; G11B 19/048
USPC ............ 714/6.1, 6.11, 6.2, 6.22, 6.24, 25, 30, 714/42, 48, 52, 720, 702, 752, 755, 763, 714/764, 768–770, 773, 785, 786, 793, 799
See application file for complete search history.

(56) References Cited

U.S. PATENT DOCUMENTS

| | | | | |
|---|---|---|---|---|
| 4,633,471 | A | * | 12/1986 | Perera et al. .................. 714/758 |
| 4,833,679 | A | * | 5/1989 | Anderson et al. ............. 714/758 |

(Continued)

OTHER PUBLICATIONS

U.S. Appl. No. 13/426,714, Shaohua Yang.

(Continued)

*Primary Examiner* — John J Tabone, Jr.
(74) *Attorney, Agent, or Firm* — Hamilton DeSanctis & Cha (57) ABSTRACT

The present invention is related to systems and methods for harmonizing testing and using a storage media. As an example, a data system is set forth that includes: a data decoder circuit, a data processing circuit, and a write circuit. The data decoder circuit is configured to decode a test data set to yield a result. The data processing circuit is configured to encode a user data set guided by the result to yield a codeword. The write circuit is configured to store an information set corresponding to the codeword to a storage medium.

25 Claims, 3 Drawing Sheets

(56) References Cited

U.S. PATENT DOCUMENTS

| | | | |
|---|---|---|---|
| 5,278,703 A | 1/1994 | Rub et al. | |
| 5,278,846 A | 1/1994 | Okayama | |
| 5,317,472 A | 5/1994 | Schweitzer, III | |
| 5,325,402 A | 6/1994 | Ushirokawa | |
| 5,392,299 A | 2/1995 | Rhines | |
| 5,417,500 A | 5/1995 | Martinie | |
| 5,513,192 A | 4/1996 | Janku | |
| 5,523,903 A | 6/1996 | Hetzler | |
| 5,550,810 A | 8/1996 | Monogioudis et al. | |
| 5,550,870 A | 8/1996 | Blaker | |
| 5,612,964 A | 3/1997 | Haraszti | |
| 5,710,784 A | 1/1998 | Kindred | |
| 5,717,706 A | 2/1998 | Ikeda | |
| 5,802,118 A | 9/1998 | Bliss | |
| 5,844,945 A | 12/1998 | Nam | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | McCallister | |
| 6,023,783 A | 2/2000 | Divsalar | |
| 6,029,264 A | 2/2000 | Kobayashi | |
| 6,052,815 A * | 4/2000 | Zook | 714/758 |
| 6,065,149 A | 5/2000 | Yamanaka | |
| 6,097,764 A | 8/2000 | McCallister | |
| 6,145,110 A | 11/2000 | Khayrallah | |
| 6,216,249 B1 | 4/2001 | Bliss | |
| 6,216,251 B1 | 4/2001 | McGinn | |
| 6,266,795 B1 | 7/2001 | Wei | |
| 6,317,472 B1 | 11/2001 | Choi | |
| 6,351,832 B1 | 2/2002 | Wei | |
| 6,377,610 B1 | 4/2002 | Hagenauer | |
| 6,381,726 B1 | 4/2002 | Weng | |
| 6,473,878 B1 | 10/2002 | Wei | |
| 6,535,553 B1 | 3/2003 | Limberg et al. | |
| 6,615,387 B1 * | 9/2003 | Williamson et al. | 714/785 |
| 6,625,775 B1 | 9/2003 | Kim | |
| 6,748,034 B2 | 6/2004 | Hattori | |
| 6,757,862 B1 | 6/2004 | Marianetti, II | |
| 6,785,863 B2 | 8/2004 | Blankenship | |
| 6,810,502 B2 | 10/2004 | Eidson | |
| 6,970,511 B1 | 11/2005 | Barnette | |
| 6,986,098 B2 | 1/2006 | Poeppelman | |
| 7,020,811 B2 * | 3/2006 | Byrd | 714/703 |
| 7,047,474 B2 | 5/2006 | Rhee | |
| 7,058,873 B2 | 6/2006 | Song | |
| 7,073,118 B2 | 7/2006 | Greenberg | |
| 7,093,179 B2 | 8/2006 | Shea | |
| 7,096,409 B2 * | 8/2006 | Banks | 714/784 |
| 7,117,427 B2 | 10/2006 | Ophir | |
| 7,133,228 B2 | 11/2006 | Fung | |
| 7,171,591 B2 * | 1/2007 | Chen | 714/52 |
| 7,184,486 B1 | 2/2007 | Wu | |
| 7,188,296 B1 * | 3/2007 | Cypher | 714/755 |
| 7,191,378 B2 | 3/2007 | Eroz | |
| 7,203,887 B2 | 4/2007 | Eroz | |
| 7,308,061 B1 | 12/2007 | Huang | |
| 7,310,768 B2 | 12/2007 | Eidson | |
| 7,313,750 B1 | 12/2007 | Feng | |
| 7,370,258 B2 | 5/2008 | Iancu | |
| 7,415,651 B2 | 8/2008 | Argon | |
| 7,500,173 B2 * | 3/2009 | Paul et al. | 714/807 |
| 7,502,189 B2 | 3/2009 | Sawaguchi | |
| 7,523,375 B2 | 4/2009 | Spencer | |
| 7,562,282 B1 * | 7/2009 | Rothberg | 714/785 |
| 7,587,657 B2 | 9/2009 | Haratsch | |
| 7,590,168 B2 | 9/2009 | Raghavan | |
| 7,646,829 B2 | 1/2010 | Ashley | |
| 7,698,088 B2 * | 4/2010 | Sul et al. | 702/122 |
| 7,702,986 B2 | 4/2010 | Bjerke | |
| 7,752,523 B1 | 7/2010 | Chaichanavong | |
| 7,779,325 B2 | 8/2010 | Song | |
| 7,802,172 B2 | 9/2010 | Vila Casado | |
| 7,948,848 B2 * | 5/2011 | Hsueh et al. | 369/53.35 |
| 7,952,824 B2 | 5/2011 | Dziak | |
| 7,958,425 B2 | 6/2011 | Chugg | |
| 7,996,746 B2 | 8/2011 | Livshitz | |
| 8,018,360 B2 | 9/2011 | Nayak | |
| 8,201,051 B2 | 6/2012 | Tan | |
| 8,237,597 B2 | 8/2012 | Liu | |
| 8,261,171 B2 | 9/2012 | Annampedu | |
| 8,291,284 B2 | 10/2012 | Savin | |
| 8,295,001 B2 | 10/2012 | Liu | |
| 8,612,834 B2 * | 12/2013 | Kwok et al. | 714/781 |
| 8,826,110 B2 * | 9/2014 | Jin et al. | 714/793 |
| 2002/0157044 A1 * | 10/2002 | Byrd | 714/703 |
| 2004/0199855 A1 * | 10/2004 | Heylen | 714/769 |
| 2005/0278610 A1 * | 12/2005 | Banks | 714/784 |
| 2008/0069373 A1 | 3/2008 | Jiang | |
| 2008/0114562 A1 * | 5/2008 | Sul et al. | 702/122 |
| 2008/0304558 A1 | 12/2008 | Zhu et al. | |
| 2009/0132893 A1 | 5/2009 | Miyazaki | |
| 2009/0185643 A1 | 7/2009 | Fitzpatrick | |
| 2009/0257331 A1 * | 10/2009 | Hsueh et al. | 369/47.32 |
| 2010/0211856 A1 * | 8/2010 | Weingarten | 714/777 |
| 2011/0167227 A1 | 7/2011 | Yang | |
| 2011/0264987 A1 | 10/2011 | Li | |
| 2012/0124118 A1 | 5/2012 | Ivkovic | |
| 2012/0182643 A1 | 7/2012 | Zhang | |
| 2012/0207201 A1 | 8/2012 | Xia | |
| 2012/0212849 A1 | 8/2012 | Xu | |
| 2012/0262814 A1 | 10/2012 | Li | |
| 2012/0265488 A1 | 10/2012 | Sun | |

OTHER PUBLICATIONS

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LPDC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. On Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

(56) References Cited

OTHER PUBLICATIONS

Shokrollahi "LDPC Codes: An Introduction", Digital Fountain, Inc. (Apr. 2, 2003).

Spagnol et al, "Hardware Implementation of GF(2m) LDPC Decoders", IEEE Transactions on Circuits and Systemsŝi: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/186,234, Unpublished (filed Jul. 19, 2011) (Haitao Xia).

U.S. Appl. No. 13/327,279, Unpublished (filed Dec. 15, 2011) (Wei Feng).

U.S. Appl. No. 13/340,974, Unpublished (filed Dec. 30, 2011) (Dan Liu).

U.S. Appl. No. 13/445,848, Unpublished (filed Apr. 12, 2012) (Bruce Wilson).

U.S. Appl. No. 13/340,951, Unpublished (filed Dec. 30, 2011) (Lei Chen).

U.S. Appl. No. 13/369,468, Unpublished (filed Feb. 9, 2012) (Zongwang Li).

U.S. Appl. No. 13/269,852, Unpublished (filed Oct. 10, 2011) (Haitao Xia).

U.S. Appl. No. 13/284,730, Unpublished (filed Oct. 28, 2011) (Fan Zhang).

U.S. Appl. No. 13/295,150, Unpublished (filed Nov. 14, 2011) (Zongwang Li).

U.S. Appl. No. 13/284,767, Unpublished (filed Oct. 28, 2011) (Fan Zhang).

U.S. Appl. No. 13/269,832, Unpublished (filed Oct. 10, 2011) (Haitao Xia).

U.S. Appl. No. 13/445,878, Unpublished (filed Apr. 12, 2012) (Yu Liao).

U.S. Appl. No. 13/239,683, Unpublished (filed Sep. 22, 2011) (Changyou Xu).

U.S. Appl. No. 13/283,549, Unpublished (filed Oct. 27, 2011) (Wu Chang).

U.S. Appl. No. 13/213,751, Unpublished (filed Aug. 19, 2011) (Fan Zhang).

U.S. Appl. No. 13/174,537, Unpublished (filed Jun. 30, 2011) (Anantha Raman Krishnan).

U.S. Appl. No. 13/296,022, Unpublished (filed Nov. 14, 2011) (Victor Krachkovsky).

U.S. Appl. No. 13/305,551, Unpublished (filed Nov. 28, 2011) (Yang Han).

U.S. Appl. No. 13/227,416, Unpublished (filed Sep. 7, 2011) (Lei Chen).

U.S. Appl. No. 13/305,510, Unpublished (filed Nov. 28, 2011) (Lei Chen).

U.S. Appl. No. 13/302,119, Unpublished (filed Nov. 22, 2011) (Lei Chen).

U.S. Appl. No. 13/300,078, Unpublished (filed Nov. 18, 2011) (Chung-Li Wang).

U.S. Appl. No. 13/174,453, Unpublished (filed Jun. 30, 2011) (Johnson Yen).

U.S. Appl. No. 13/180,495, Unpublished (filed Jul. 11, 2011) (Chung-Li Wang).

U.S. Appl. No. 13/415,326, Unpublished (filed Mar. 8, 2012) (Shaohua Yang).

U.S. Appl. No. 13/227,544, Unpublished (filed Sep. 8, 2011) (Shaohua Yang).

U.S. Appl. No. 13/483,100, Unpublished (filed May 30, 2012) (Fan Zhang).

U.S. Appl. No. 13/426,693, Unpublished (filed Mar. 22, 2012) (Shaohua Yang).

U.S. Appl. No. 13/545,833, Unpublished (filed Jul. 10, 2012) (Zhi Bin Li).

U.S. Appl. No. 13/483,105, Unpublished (filed May 30, 2012) (Xuebin Wu).

U.S. Appl. No. 13/316,741, Unpublished (filed Dec. 12, 2011) (Yang Han).

U.S. Appl. No. 13/113,219, Unpublished (filed May 23, 2011) (Yang Han).

U.S. Appl. No. 13/415,430, Unpublished (filed Mar. 8, 2012) (Nayak Ratnakar Aravind).

U.S. Appl. No. 13/171,615, Unpublished (filed Jun. 29, 2011) (Bradley D. Seago).

U.S. Appl. No. 13/474,660, Unpublished (filed May 17, 2012) (Zongwang Li).

U.S. Appl. No. 13/422,986, Unpublished (filed Mar. 16, 2012) (Fan Zhang).

U.S. Appl. No. 13/372,580, Unpublished (filed Feb. 14, 2012) (Fan Zhang).

U.S. Appl. No. 13/426,714, Unpublished (filed Mar. 22, 2012) (Shaohua Yang).

U.S. Appl. No. 13/412,520, Unpublished (filed Mar. 5, 2012) (Fan Zhang).

U.S. Appl. No. 13/362,409, Unpublished (filed Jan. 31, 2012) (Fan Zhang).

U.S. Appl. No. 13/316,858, Unpublished (filed Dec. 12, 2011) (Zongwang Li).

U.S. Appl. No. 13/433,693, Unpublished (filed Mar. 29, 2012) (Fan Zhang).

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.

Xiao, et al "Nested Codes With Multiple Interpretations" retrieved from the Internet URL: http://www.ece.nmsu.edu/~jkliewer/paper/XFKC_CISS06.pdf (retrieved on Dec. 5, 201.

Yeo et al., "VLSI Architecture for Iterative Decoders in Magnetic Storage Channels", Mar. 2001, pp. 748-755, IEEE trans. Magnetics, vol. 37, No. 2.

Zhang et al., "Analysis of Verification-Based Decoding on the q-ary Symmetric Channel for Large q", IEEE Trans. On Information Theory, vol. 57, No. 10 (Oct. 2011).

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, vol. 43, pp. 1118-1123, Mar. 2007.

Zhong, "Block-LDPC: A Practical LDPC Coding System Design Approach", IEEE Trans. On Circuits, Regular Papers, vol. 5, No. 4, pp. 766-775, Apr. 2005.

\* cited by examiner

SYSTEMS AND METHODS FOR NON-ZERO SYNDROME BASED PROCESSING

BACKGROUND OF THE INVENTION

The present invention is related to systems and methods for using storage media, and more particularly to systems and methods for harmonizing testing and using a storage media.

Storage devices are tested by writing a test pattern to a storage medium included in the storage device followed by reading the storage medium and determining whether the test pattern was properly retrieved. The test data written to the storage device includes patterns designed to expose one or more flaws in the storage device. These test patterns are not valid codewords, and thus prior to shipping the tested storage device to an end user, the storage medium is re-written with valid codewords. This process of writing, testing, and re-writing is time consuming.

Hence, for at least the aforementioned reasons, there exists a need in the art for advanced systems and methods for testing and/or storing a storage device.

BRIEF SUMMARY OF THE INVENTION

The present invention is related to systems and methods for performing data processing, and more specifically to systems and methods for applying two or more data decode algorithms to a processing data set.

Some embodiments of the present invention provide data processing circuits that include: a data decoding circuit and a write circuit. The data decoding circuit is operable to receive a user data set, and encode the user data set in conformance with a test data set to yield a codeword. The write circuit is operable to store an information set corresponding to the codeword to a storage medium.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for using storage media, and more particularly to systems and methods for harmonizing testing and using a storage media.

Various embodiments of the present invention provide for forming specific test patterns into decodable data sets. Such embodiments operate by aggregating a specific test pattern with a defined test seed pattern to yield a test set, and aggregating user data with a defined user seed pattern to yield a user data set. A syndrome for the specific test pattern is calculated, and the calculated syndrome is used as a desired result of a data encoding process used to encode the user data set to yield a codeword. At the same time, the test data set is identified as a codeword. As such, the codewords (both the codeword corresponding to the aggregated test data and test seed, and the codeword corresponding to the encoded user data) are decodable as they both yield the same syndrome equal to the aforementioned calculated syndrome. By using such an approach, the test patterns may be written to the storage medium and used for testing purposes, and there is not a need to re-write the storage medium with decodable data sets prior to shipping as the test data set is decodable. The decoded test data and user data is differentiated based upon recovery of either the test seed or user seed One or more embodiments of the present invention provide storage devices that include: a storage medium, a data processing circuit, and a write circuit. A test pattern is stored on the storage medium, and the data processing circuit is operable to encode a user data set in conformance with the test pattern to yield a codeword. The write circuit is operable to write a set of data to the storage medium that corresponds to the codeword. In some instances of the aforementioned embodiments, the storage device further includes a solid state memory device. In one or more instances of the aforementioned embodiments, the write circuit includes a read/write head assembly disposed in relation to the storage medium and operable to store an information set corresponding to the codeword to the storage medium. In one or more instances of the aforementioned embodiments, the storage device is implemented as part of a redundant array of inexpensive disks.

In various instances of the aforementioned embodiments, the data processing circuit is further operable to decode the codeword in conformance with the test pattern to yield a decoded output. In some such instances, encoding the user data set is done using a low density parity check encoding algorithm, and decoding the codeword is done using a low density parity check decoding algorithm.

In some instances of the aforementioned embodiments, the test pattern corresponds to a syndrome value, and encoding the user data set in conformance with the test pattern includes encoding the user data set using the syndrome value. In some such instances, the syndrome value is the value resulting from applying a data decoding algorithm to a test data set including the test pattern. In various such instances, the data processing circuit is further operable to decode the codeword based upon the syndrome value to yield a decoded output. In some cases, the test data set further includes a test seed, wherein the user data set includes a user seed and a user data, and wherein the test seed is different from the user seed. In various cases, the storage device further includes a dis-aggregating circuit operable to separate an identifier seed from a set of data. The identifier is one of the user seed, or the test seed. In particular cases, a comparator circuit is operable to compare the identifier with a known user seed. The set of data is processed as user data when the identifier is the same as the user seed.

Other embodiments of the present invention provide data processing circuits that include: a data decoding circuit and a write circuit. The data decoding circuit is operable to receive a user data set, and encode the user data set in conformance with a test data set to yield a codeword. The write circuit is operable to store an information set corresponding to the codeword to a storage medium. In some instances of the aforementioned embodiments, the storage medium stores the test data set prior to storing the information set to the storage medium. In some cases, the information set is a first information set and the codeword is a first codeword. In such cases, the data encoding circuit is further operable to receive the test data set and to identify the test data set as a second codeword, and the write circuit is further operable store a second information set corresponding to the second codeword to the storage medium.

In various cases, the circuit further includes a data decoding circuit operable to decode the codeword in conformance with the test pattern to yield a decoded output. In some cases, the test pattern corresponds to a syndrome value, and encoding the user data set in conformance with the test pattern includes encoding the user data set using the syndrome value. In one particular case, the syndrome value is the value resulting from applying a data decoding algorithm to a test data set including the test pattern. In one or more instances of the aforementioned embodiments, the syndrome value is the value resulting from applying a data decoding algorithm to a test data set including the test pattern, and decoding the codeword in conformance with the test pattern to yield a decoded output includes decoding the codeword using the syndrome value. In some such instances, the test data set further includes a test seed and the user data set includes a user seed and a user data. The test seed is different from the user seed.

Figure 1:
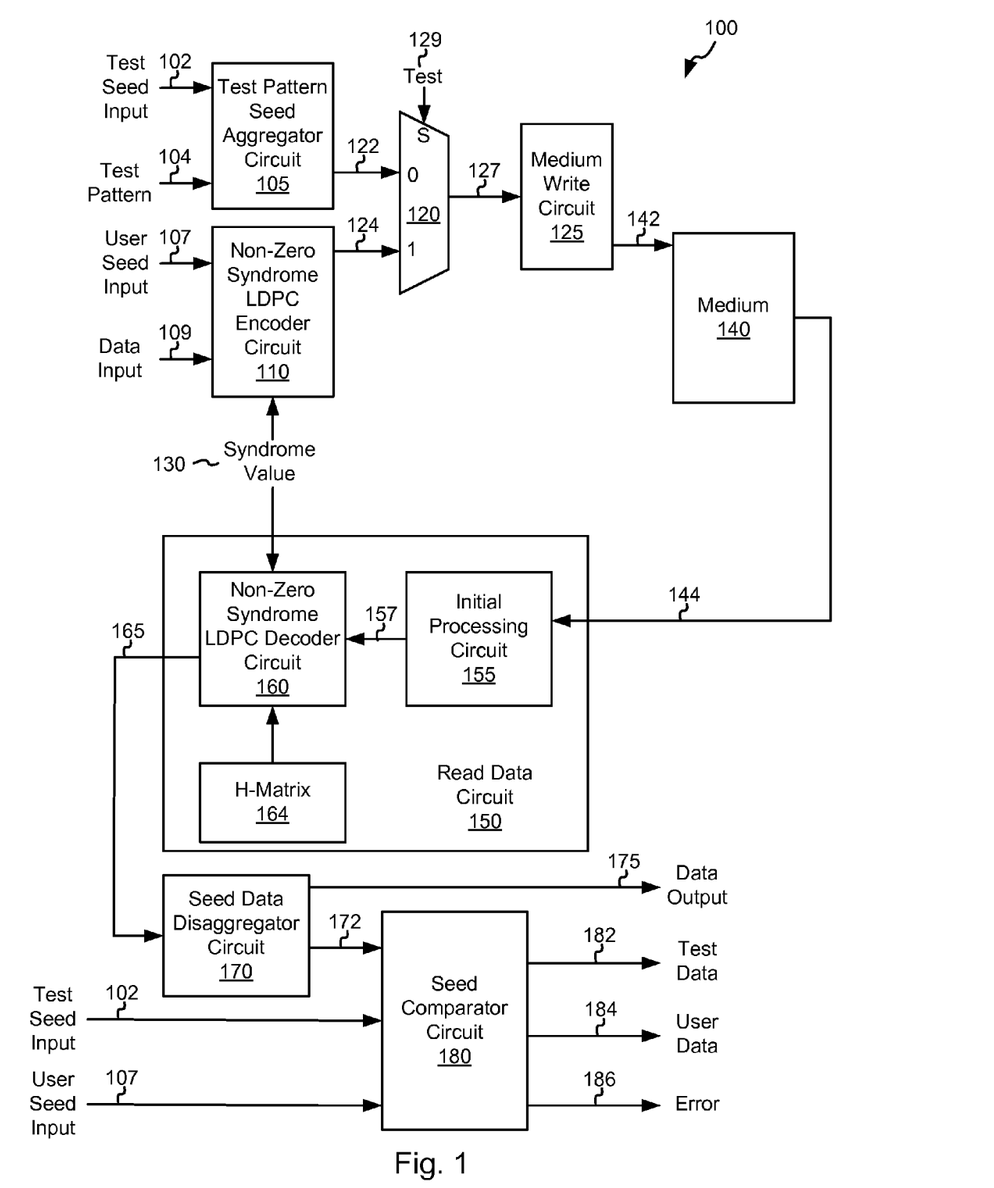
FIG. 1 shows a data processing circuit including non-zero syndrome based encoding and decoding circuitry in accordance with one or more embodiments of the present invention.

Turning to FIG. 1, a data processing circuit 100 is shown that includes non-zero syndrome based encoding and decoding circuitry in accordance with one or more embodiments of the present invention. Data processing circuit 100 includes a test pattern seed aggregator circuit 105 that aggregates a test pattern 104 with a test seed input 102 to yield a test codeword 122. A syndrome value for test pattern 104 is calculated to yield a syndrome value 130. Syndrome value 130 corresponds to the syndrome value that would result where test codeword 122 is decoded using a downstream non-zero syndrome low density parity check (LDPC) decoder circuit 160. Syndrome value 130 may be calculated offline based upon the known last test data set to be written to a storage medium. Where it is assumed that the last round of testing of the storage device included writing a test data pattern to the storage medium, a data decoding results in syndrome value 130 in accordance with the following equation:

$$\text{syndrome value } 130 = [H1, H2] * [\text{test seed input } 102, \text{test pattern } 104]^T$$
$$= SS + SA$$

where SS=H1*test seed input 102, and SA=H2*test pattern 104. The second bracket set is a column vector as indicated by a transposition symbol T. Test seed input 102 and user seed input 107 are selected as values that when in a particular location of a converged decoded output will uniquely identify the decoded data set as a user data set or a test data set.

A non-zero syndrome LDPC encoder circuit 110 is operable to aggregate a data input 109 and a user seed input 107 to yield a user data set, and to encode the user data set such that it exhibits syndrome value 130. In a traditional encoding scenario, a user data set is encoded to include parity data such that the following equation is true:

$$[H1,H2]*[\text{user seed input } 107, \text{data input } 109]^T=0.$$

The second bracket set is a column vector as indicated by a transposition symbol T. In the present invention, non-zero syndrome LDPC encoder circuit 110 encodes the combination of data input 109 (i.e., user data) and user seed input 107 to include parity data such that the following equation is true:

$$[H1,H2]*[\text{user seed input } 107, \text{data input } 109]^T = H1*\text{user seed input } 107+SA=\text{syndrome value } 130.$$

Non-zero syndrome LDPC encoder circuit 110 provides the encoded codeword as a user codeword 124.

User codeword 124 and test codeword 122 are provided to a selector circuit 120 that selects one of user codeword 124 or test codeword 122 as a codeword 127 based upon a test input 129. Test input 129 is asserted to select test codeword 122 when the storage device is to be tested. Test input 129 is asserted to select user codeword 124 when standard data storage is to be performed. Test input 129 may be fixed once the storage device is shipped.

Codeword 127 is provided to a medium write circuit 125 which prepares a corresponding information set 142 for writing the a medium 140. Medium write circuit 125 may be any circuit or device known in the art that is capable of receiving a data set and formatting that data set for writing to medium 140. In some cases, medium 140 is a magnetic storage medium. In such cases, medium write circuit 125 includes write circuitry that feeds a write pattern to a read/write head assembly that is operable to form magnetic patterns on the magnetic storage medium.

The previously written information is accessed from medium 140 as a read codeword 144. Read codeword 144 is provided to a read data circuit 150. Read data circuit 150 includes an initial processing circuit 155 and a non-zero syndrome LDPC decoder circuit 160 that relies on an H-matrix 164. Initial processing circuit 155 includes a number of circuits operable to prepare read codeword 144 for presentation as a codeword 157 to non-zero syndrome LDPC decoder circuit 160. For example, in one embodiment of the present invention where medium 140 is a magnetic storage medium, initial processing circuit 155 includes a read/write head assembly operable to sense information from medium 140, a preamplifier circuit, an analog front end circuit operable to amplify and filter the received input, an analog to digital converter circuit operable to convert an analog input into a series of corresponding digital samples, an equalizer, and a data detector circuit. Based upon the disclosure provided herein, one of ordinary skill in the art will recognize a variety of circuitry and/or architectures that may be used to prepare read codeword 144 for presentation as codeword 157 to non-zero syndrome LDPC decoder circuit 160 in accordance with different embodiments of the present invention.

Non-zero syndrome LDPC decoder circuit 160 applies an LDPC decoder algorithm to codeword 157 using an H-matrix

164. This decoding is considered to have converged on the original data set where the resulting syndrome is equal to syndrome value 130. This will occur whether the received data set was either generated from test pattern 104 or data input 109. Once application of the LDPC decoder algorithm converges, a converged output 165 is provided to a seed data dis-aggregator circuit 170. Converged output 165 corresponds to either the aggregation of user seed input 107 and data input 109 prior to encoding, or the aggregation of test seed input 102 and test pattern 104. The seed data (i.e., test seed input 102 or user seed input 107) included as part of converged output 165 is separated from the remainder of the data set (i.e., test pattern 104 or data input 109). The non-seed portion of converged output 165 is provided as a data output 175. The seed portion of converged output 165 is provided as a seed output 172 to a seed comparator circuit 180.

Seed comparator circuit 180 compares seed output 172 with test seed input 102 and user seed input 107. Where seed output 172 is equal to test seed input 102, seed comparator circuit 180 asserts a test data output 182 that results in treating data output 175 as test data. Alternatively, where seed output 172 is equal to user seed input 107, seed comparator circuit 180 asserts a user data output 184 that results in treating data output 175 as user data. Where seed output 172 does not match either test seed input 102 or user seed input 107, seed comparator circuit 180 asserts an error output 186. Such an error condition may occur, for example, where the user seed is not programmed correctly.

Figure 2:
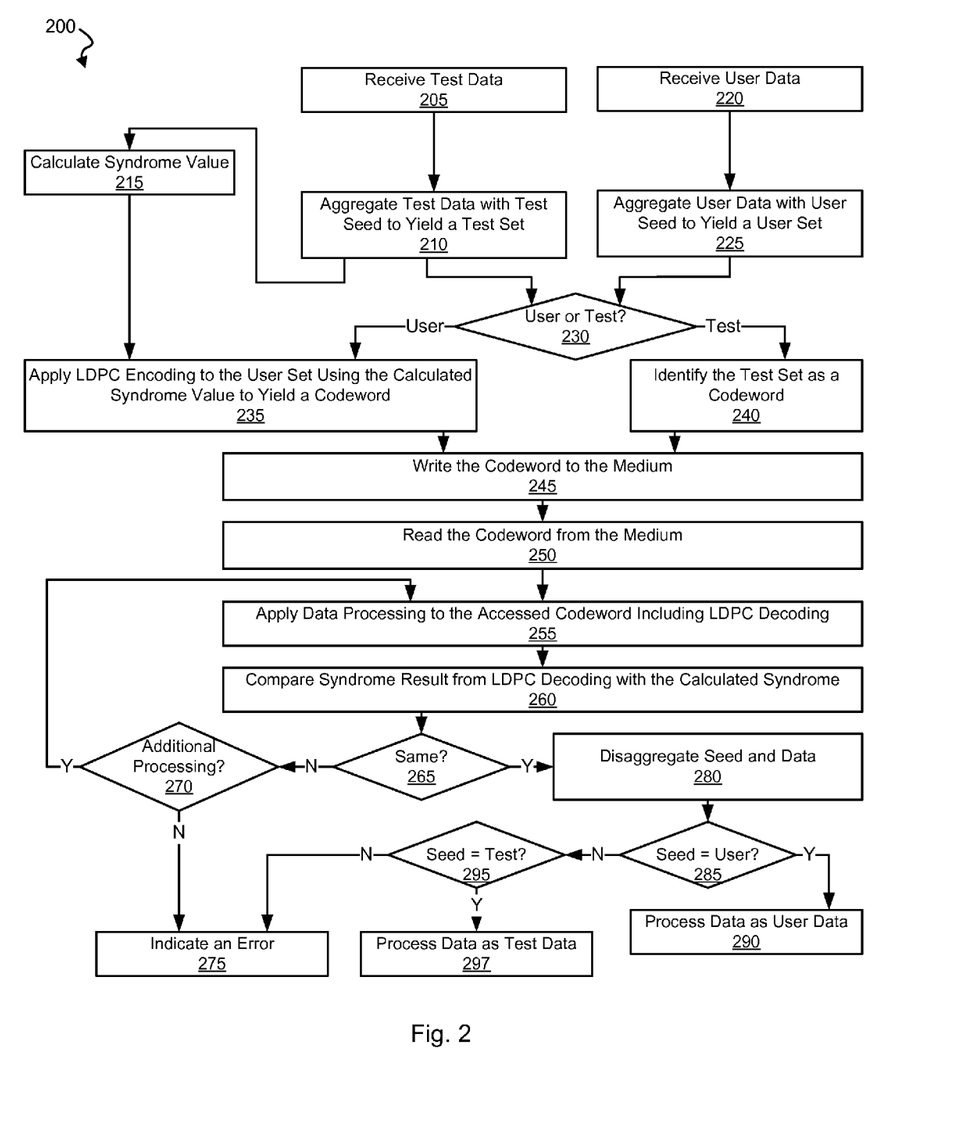
FIG. 2 is a flow diagram showing a method in accordance with some embodiments of the present invention for harmonizing testing and using a storage medium in accordance with various embodiments of the present invention.

Turning to FIG. 2, a flow diagram 200 shows a method in accordance with some embodiments of the present invention for harmonizing testing and using a storage medium in accordance with various embodiments of the present invention. Following flow diagram 200, test data is received (block 205) which is aggregated with a test seed to yield a test set (block 210). The test seed is used to differentiate test data from user data. A syndrome value for the test set is calculated (block 215). The syndrome value is the value that would result where a test codeword is decoded using a downstream non-zero syndrome low density parity check (LDPC) decoder circuit. The syndrome value may be calculated offline based upon the known last test data set to be written to a storage medium. Where it is assumed that the last round of testing of the storage device included writing a test data pattern to the storage medium, a data decoding results in a syndrome value in accordance with the following equation:

$$\text{syndrome value} = [H1, H2]^*[\text{test seed}, \text{test data}]^T = SS + SA,$$

where $SS = H1^*\text{test seed}$, and $SA = H2^*\text{test data}$. The second bracket set is a column vector as indicated by a transposition symbol T. The test seed and a user seed are selected as values that when in a particular location of a converged decoded output will uniquely identify the decoded data set as a user data set or a test data set.

Alternatively, user data is received (block 220), and aggregated with a user seed to yield a user set (block 225). It is determined whether standard user data or test data are to be written to a storage medium (block 230). Where test data is to be written (block 230), the test data is identified as a codeword to be written (block 240). Alternatively, where user data is to be written (block 230), LDPC encoding is applied to the user set using the calculated syndrome value to yield a codeword to be written to the storage medium (block 235). A non-zero syndrome LDPC encoder circuit encodes the combination of user data and the user seed to include parity data such that the following equation is true:

$$[H1, H2]^*[\text{user seed}, \text{user data}]^T = H1^*\text{user seed} + sa = \text{Calculated Syndrome Value}.$$

The second bracket set is a column vector as indicated by a transposition symbol T.

In either case (Test or User), the resulting codeword is written to a storage medium (block 245). The data may be written to the storage medium using any approach for writing a storage medium known in the art. The data is later read from the storage medium (block 250). This read may be done using any approach known in the art. Data processing is applied to recover originally written data from the codeword (block 255). The data processing includes, but is not limited to, LDPC decoding. The LDPC decoding results in a syndrome which is compared against the previously calculated syndrome value. It is determined whether the syndrome value resulting from the LDPC decoding is the same as the previously calculated syndrome value (block 265).

Where the syndrome value resulting from the LDPC decoding is not the same as the previously calculated syndrome value (block 265), the data decoding process has not converged and it is determined whether additional processing is to be performed (block 270). A number of iterations through the data processing may be allowed, and additional processing may be thus allowable where the number iterations have not yet been exhausted. Where additional processing is to be performed (block 270), the processes of blocks 255, 260, 265 are repeated. Alternatively, where additional processing is not allowed (block 270), an error is indicated (block 275) as the LDPC decoding failed to converge.

Alternatively, where the syndrome value resulting from the LDPC decoding is the same as the previously calculated syndrome value (block 265), the data decoding process has converged. In such a case, the seed (test seed or user seed) is dis-aggregated from the data (test data or user data) (block 280). The seed data is then compared with the known user seed to determine whether the disaggregated data is user data (block 285). Where it is determined that the seed is equal to the user seed (block 285), the dis-aggregated data is processed as user data (block 290).

Alternatively, where it is determined that the seed is not equal to the user seed (block 285), it is determined whether the seed is equal to the known test seed (block 295), the disaggregated data is processed as test data (block 297). Where the seed is not equal to the user seed or the test seed (block 285 and block 295), an error is indicated (block 275).

Other embodiments may operate by encoding cyclic redundancy check (CRC) bits incorporated in a data set to differentiate between real data and test pattern data. For example, a portion of CRC bits derived from the user data input into the system may be designated CRC1. The remaining portion of the CRC bits from the user data are XORd with a provided seed pattern with the result being designated as CRC2. The data is then written to the storage medium.

During reading of the data from the storage medium, if CRC1 and CRC2 matches that of the test pattern, a test pattern is declared. Alternatively, if CRC1 is zero and CRC2 matches the provided seed pattern, decoding properly converged and the provided seed is correct. Alternatively, if CRC1 is zero, and CRC2 does not match the provided seed pattern, decoding may have properly converged and the provided seed is possibly incorrect. As yet another alternative, if CRC1 is not zero and CRC2 matches the provided seed pattern, decoding failed to properly converge.

In the aforementioned scenario, the test pattern corresponds to a specific CRC bit pattern and CRC bit error pattern. The CRC bit pattern is part of the data (i.e., the CRC data padded to originally received user data) after both LDPC decoding and run length limited decoding; and the CRC bit error pattern is an XOR of the CRC bit pattern at the output of the run length limited decoder circuit included as part of a read channel device. If both the CRC bit pattern and the CRC bit error pattern match those corresponding to the test pattern, the data is from a test pattern and is not real user data. Otherwise, the data is treated as real user data.

Figure 3:
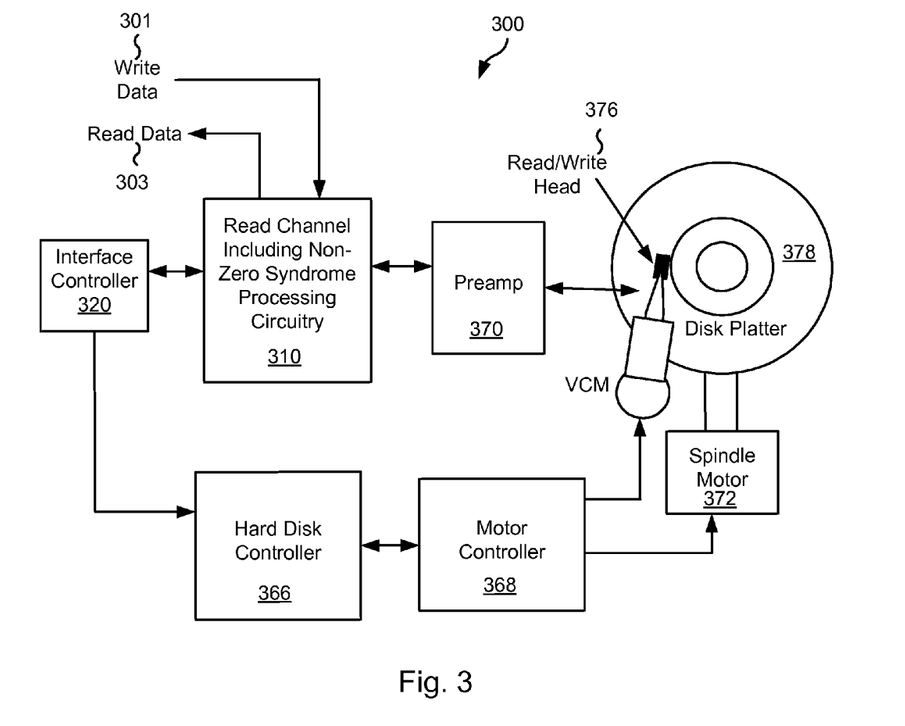
FIG. 3 shows a storage device including a read channel circuit including non-zero syndrome based encoding and decoding circuitry in accordance with one or more embodiments of the present invention.

Turning to FIG. 3, a storage device 300 is depicted that includes a read channel 310 including non-zero syndrome based encoding and decoding circuitry in accordance with one or more embodiments of the present invention. Storage system 300 may be, for example, a hard disk drive. Storage system 300 also includes a preamplifier 370, an interface controller 320, a hard disk controller 366, a motor controller 368, a spindle motor 372, a disk platter 378, and a read/write head assembly 376. Interface controller 320 controls addressing and timing of data to/from disk platter 378. The data on disk platter 378 consists of groups of magnetic signals that may be detected by read/write head assembly 376 when the assembly is properly positioned over disk platter 378. In one embodiment, disk platter 378 includes magnetic signals recorded in accordance with either a longitudinal or a perpendicular recording scheme.

In a typical read operation, read/write head assembly 376 is accurately positioned by motor controller 368 over a desired data track on disk platter 378. Motor controller 368 both positions read/write head assembly 376 in relation to disk platter 378 and drives spindle motor 372 by moving read/write head assembly to the proper data track on disk platter 378 under the direction of hard disk controller 366. Spindle motor 372 spins disk platter 378 at a determined spin rate (RPMs). Once read/write head assembly 376 is positioned adjacent the proper data track, magnetic signals representing data on disk platter 378 are sensed by read/write head assembly 376 as disk platter 378 is rotated by spindle motor 372. The sensed magnetic signals are provided as a continuous, minute analog signal representative of the magnetic data on disk platter 378. This minute analog signal is transferred from read/write head assembly 376 to read channel circuit 310 via preamplifier 370. Preamplifier 370 is operable to amplify the minute analog signals accessed from disk platter 378. In turn, read channel circuit 310 decodes and digitizes the received analog signal to recreate the information originally written to disk platter 378. This data is provided as read data 303 to a receiving circuit. A write operation is substantially the opposite of the preceding read operation with write data 301 being provided to read channel circuit 310. This data is then encoded and written to disk platter 378.

During operation, a specific test data set or a user data set may be received and prepared for writing to disk platter 378. When a specific test data set is received, it is aggregated with a test seed to yield a codeword which is written to disk platter 378. In addition, a syndrome of the specific test data set is calculated. When user data is received, it is aggregated with a user seed to yield a user data set. The user data set is then encoded using the aforementioned calculated syndrome as a result of the encoding. This encoding yields a codeword that is written to the storage medium. In either the case of test data or user data, application of a decoding algorithm should yield the same calculated syndrome when the decoding converges. When a codeword is accessed from the storage medium, the codeword is decoded with convergence of the decoding occurring when the resulting syndrome matches the previously mentioned calculated syndrome. The converged result is disaggregated to yield the seed and the original data. Where the seed corresponds to the test seed the data is treated as test data, and where the seed corresponds to the user seed the data is treated as user data. By using such an approach, the test patterns may be written to the storage medium and used for testing purposes, and there is not a need to re-write the storage medium with decodable data sets prior to shipping as the test data set is decodable. The circuit for processing data sets and differentiating between test data and user data may be implemented similar to that discussed above in relation to FIG. 1. The method for processing data set and differentiating between test data and user data may be implemented similar to that discussed above in relation to FIG. 2.

It should be noted that storage system 300 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 300, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

In addition, it should be noted that storage system 300 may be modified to include solid state memory that is used to store data in addition to the storage offered by disk platter 378. This solid state memory may be used in parallel to disk platter 378 to provide additional storage. In such a case, the solid state memory receives and provides information directly to read channel circuit 310. Alternatively, the solid state memory may be used as a cache where it offers faster access time than that offered by disk platter 378. In such a case, the solid state memory may be disposed between interface controller 320 and read channel circuit 310 where it operates as a pass through to disk platter 378 when requested data is not available in the solid state memory or when the solid state memory does not have sufficient storage to hold a newly written data set. Based upon the disclosure provided herein, one of ordinary skill in the art will recognize a variety of storage systems including both disk platter 378 and a solid state memory.

A data decoder circuit used in relation to read channel circuit 310 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the system comprising:
   a decoder circuit configured to decode a test data set to yield a result;
   a data processing circuit configured to encode a user data set guided by the result to yield a codeword, wherein a subsequent decode of the codeword would yield the result; and
   a write circuit configured to write an information set to a storage medium that corresponds to the codeword.

2. The data processing system of claim 1, wherein the decoder circuit is further configured to decode the codeword using the result to yield a decoded output.

3. The data processing system of claim 2, wherein encoding the user data set is done using a low density parity check encoding algorithm, and wherein decoding the codeword is done using a low density parity check decoding algorithm.

4. The data processing system of claim 2, wherein the result is a syndrome value, and wherein the decoded output is identified based upon the syndrome.

5. The data processing system of claim 1, wherein the system further comprises:
   the storage medium, wherein the storage medium stores the test data set.

6. The data processing system of claim 5, wherein the write circuit is further configured to write the test data set to the storage medium.

7. The data processing system of claim 1, wherein the test data set further includes a test seed, wherein the user data set includes a user seed and a user data, and wherein the test seed is different from the user seed.

8. The data processing system of claim 7, the system further comprising:
   a dis-aggregating circuit configured to separate an identifier seed from a set of data, wherein the identifier seed is selected from a group consisting of: the user seed, and the test seed.

9. The data processing system of claim 8, the system further comprising:
   a comparator circuit configured to compare the identifier seed with a known user seed, wherein the set of data is processed as user data when the identifier seed is the same as the user seed.

10. The data processing system of claim 1, wherein the system is implemented as part of a storage device, and wherein the storage device includes:
    a solid state memory device.

11. The data processing system of claim 1, the system comprising:
    the storage medium; and
    wherein the write circuit includes a read/write head assembly disposed in relation to the storage medium and configured to store the information set corresponding to the codeword to the storage medium.

12. The data processing system of claim 1, wherein the system is implemented as part of a storage device, and wherein the storage device is implemented as part of a redundant array of inexpensive disks.

13. A data processing circuit, the data processing circuit comprising:
    a data encoding circuit configured to:
       receive a user data set; and
       encode the user data set guided by a result corresponding to a test data set to yield a codeword, wherein a subsequent decode of the codeword would yield the result; and
    a write circuit configured to store an information set corresponding to the codeword to a storage medium.

14. The data processing circuit of claim 13, wherein the storage medium stores the test data set prior to storing the information set to the storage medium.

15. The data processing circuit of claim 13, wherein the information set is a first information set, wherein the codeword is a first codeword, wherein the data encoding circuit is further configured to receive the test data set and to identify the test data set as a second codeword, and wherein the write circuit is further configured to store a second information set corresponding to the second codeword to the storage medium.

16. The data processing circuit of claim 13, wherein the data processing circuit further comprises:
    a data decoding circuit configured to decode the codeword using the result corresponding to the test data set to yield a decoded output.

17. The data processing circuit of claim 13, wherein the result corresponding to the test data set is a syndrome value, and wherein encoding the user data set guided by the result corresponding to the test data set includes encoding the user data set using the syndrome value.

18. The data processing circuit of claim 17, wherein the syndrome value is the value resulting from applying a data decoding algorithm to the test data set.

19. The data processing circuit of claim 17, wherein the syndrome value is the value resulting from applying a data decoding algorithm to the test data set that includes a test pattern, the data processing circuit further comprising:
    a data decoding circuit configured to decode the codeword using the syndrome value.

20. The data processing circuit of claim 19, wherein the test data set further includes a test seed, wherein the user data set includes a user seed and a user data, and wherein the test seed is different from the user seed.

21. The data processing circuit of claim 20, wherein the data processing circuit further comprises:
a dis-aggregating circuit configured to separate an identifier seed from a set of data, wherein the identifier seed is selected from a group consisting of: the user seed, and the test seed.

22. The data processing circuit of claim 21, wherein the data processing circuit further comprises:
a comparator circuit configured to compare the identifier seed with a known user seed, wherein the set of data is processed as user data when the identifier seed is the same as the user seed.

23. The data processing circuit of claim 13, wherein the data processing circuit is implemented as part of an integrated circuit.

24. A method for data processing, the method comprising:
providing a storage medium including a test pattern;
calculating a syndrome value for the test pattern;
receiving a user data set;
encoding the user data set using the syndrome value to yield a codeword; and
storing the codeword to the storage medium.

25. The method of claim 24, wherein the method further comprises:
accessing the codeword from the storage medium; and
decoding the codeword using the syndrome value to yield a decoded output.

\* \* \* \* \*